3,345,569

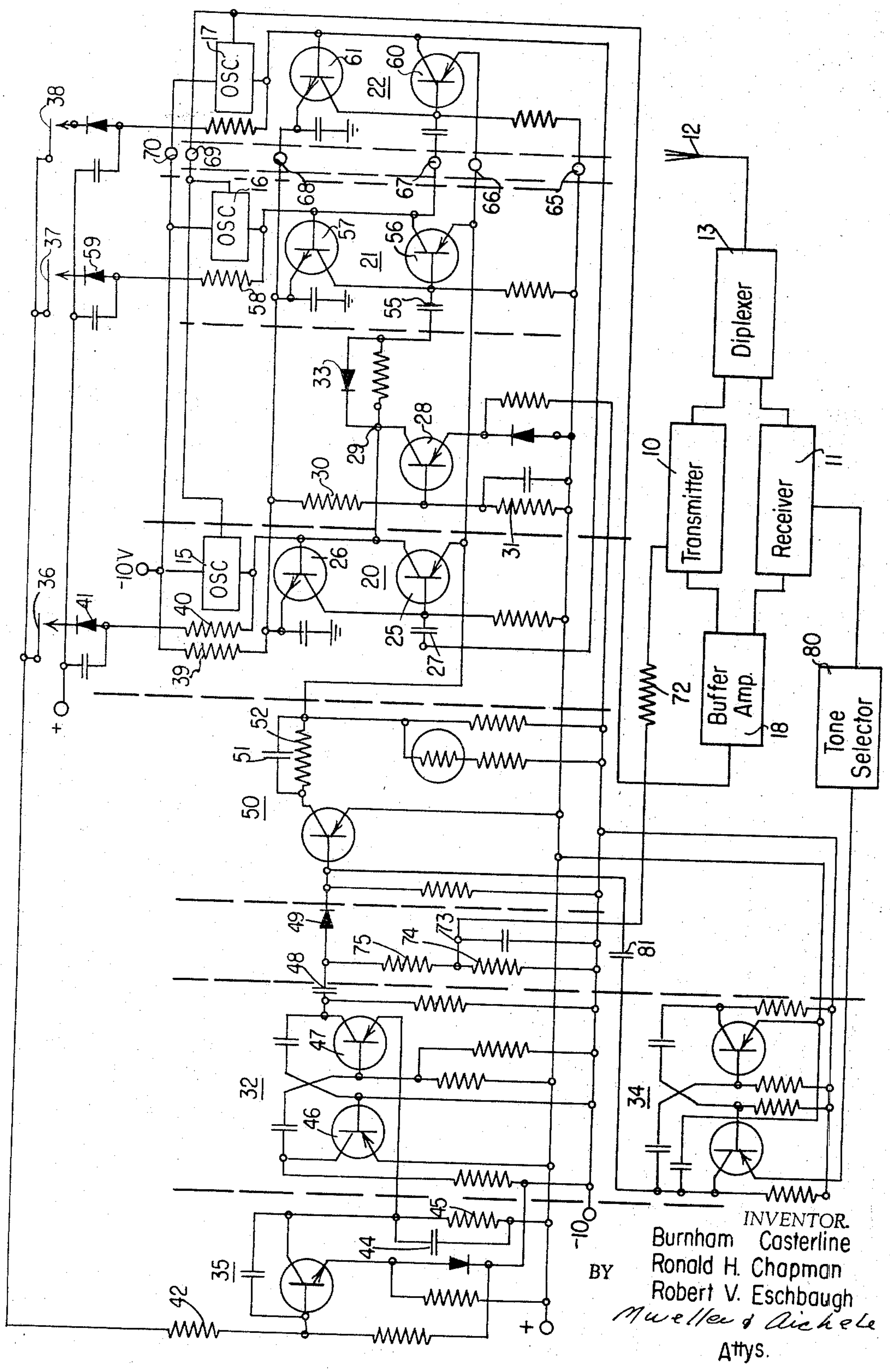
INVENTOR.
Burnham Casterline
Ronald H. Chapman
Robert V. Eschbaugh
BY
Mueller & Aichele
Attys.

ELECTRONIC CONTROL CIRCUIT INCLUDING COUNTER FOR SELECTIVELY ACTUATING ONE OF A PLURALITY OF UNITS

Burnham Casterline, Des Plaines, Ronald H. Chapman, Wheaton, and Robert V. Eschbaugh, Hillside, Ill., assignors to Motorola, Inc., Chicago, Ill., a corporation of Illinois Filed Jan. 6, 1964, Ser. No. 335,931
15 Claims. (Cl. 325—25)

This application relates generally to switching systems and more particularly to a system for energizing one of a plurality of units and which steps from one position to another until the position associated with the selected unit is reached.

In many applications it is desired to energize one of a plurality of units, with the unit to be energized being selected remotely or automatically. For example, in the tuning of radio apparatus, various arrangements have been used to selectively connect one of a plurality of tuning elements for remote or automatic tuning of a receiver or transmitter.

In two-way radio systems having a large number of stations, a plurality of channels may be provided so that a free channel will be available, at least a large part of the time, and any station in the system will not have to wait in order to use the system. In such case, it is necessary to condition the transmitter and receiver of a station for operating on the frequencies assigned to a particular channel, and to change the frequencies of the transmitter and receiver when changing from one channel to another in order to use a free channel. Since both the transmitter and receiver of such a station must be changed in frequency, systems for tuning from one channel to another have been quite complex. This is particularly true when the radio equipment is to be operated in different systems, such as in a system wherein the channel is selected manually, and also in a system wherein an idle channel which is marked in some manner is selected automatically.

It is, therefore, an object of this invention to provide a simple and improved switching system for selectively energizing one of a plurality of units.

Another object of the invention is to provide a transistorized ring counter having a plurality of stages for energizing different units, and wherein the circuit automatically steps from one stage to another until a selected stage is reached.

A further object of the invention is to provide a transistorized ring counter which selectively energizes one of a plurality of stages in turn, and wherein stages other than the energized stage are cut off so that the power utilized is a minimum.

A still further feature of the invention is to provide a ring counter circuit having a plurality of stages for selectively operating a plurality of channel units, and which acts to energize a particular stage when the circuit is first energized.

Still another object of the invention is to provide a ring counter circuit for selectively energizing oscillator units for controlling the channel of operation of radio equipment, which counter circuit steps rapidly during manual operation and slowly during automatic operation so that received radio signals can be sensed.

A feature of this invention is the provision of a system for selectively energizing one of a plurality of channel units, including a transistorized ring counter having a plurality of stages individually coupled to the channel units so that the actuated stage energizes the unit associated therewith. The stages each include a pair of complementary transistors so that both transistors are cut off when a stage is not actuated to thereby conserve power. A starting circuit is coupled to one stage so that when the system is first energized this particular stage will always be actuated.

Another feature of the invention is the provision of a circuit for selectively energizing one of a plurality of channel units including a ring counter circuit with a plurality of stages coupled to the individual units for energizing the same, and a pulsing circuit for applying pulses to the counter circuit to cause the same to step from one stage to another until the selected stage is energized. The pulsing circuit may be controlled by a remote switching device such as a push button control unit, or may be controlled by an automatic circuit responsive to the operation of the units to cause stepping until a particular operation takes place.

A further feature of the invention is the provision of a switching circuit for selectively energizing channel units, such as oscillators for controlling the channel of operation of radio equipment, and including a transistor ring counter having a stage coupled to each oscillator and with the stages coupled to each other to be energized in turn, and a multivibrator circuit for applying pulses to the ring counter to cause operation of the same until a selected oscillator is energized. One multivibrator circuit may be used to provide fast stepping when switching to a manually selected station, and a second multivibrator circuit may provide slow stepping to permit sensing of the signal received at each channel until the channel providing a particular signal is reached.

The invention is illustrated in the drawing wherein the single figure is a schematic diagram of the system of the invention.

In practicing the invention, a switching circuit is provided for connecting one of a plurality of tuning devices, such as oscillators, in turn to cause operation of two-way equipment on one of a plurality of channels. Each oscillator may control the frequency of both the transmitter and receiver of two-way equipment. The switching circuit includes a transistorized ring counter having a plurality of stages each connected to energize one of the oscillators. Each stage includes a pair of transistors which are of complementary types so that both transistors are de-energized except when the particular stage is actuated. A starting circuit is coupled to one stage so that when the equipment is turned on, or first energized, this particular stage will be actuated to provide the same starting point for the stepping operation. A first relatively fast multivibrator circuit is provided for applying pulses through a driver circuit to the ring counter. These pulses when applied cause the counter to step from one stage to the next to thereby energize one oscillator after the other. The multivibrator may be controlled by a control stage in cooperation with push button switches coupled to the stages of the ring counter, so that when the particular stage selected by the switches is actuated the multivibrator will be cut off to stop the stepping action. A second relatively slow multivibrator may also be provided to apply pulses through the driver stage to the ring counter so that each oscillator is connected in turn for a given time duration. During this time the receiver senses signals on the channel selected, and when a particular signal is received the multivibrator is cut off so that the ring counter stops. Inasmuch as the switching system should not operate during transmissions, a gate circuit may be provided which is energized by the transmitter to interrupt the application of pulses to the driver stage. The system may be arranged to step rapidly between certain channels and to step slowly between other channels to permit sensing of signals thereon.

Referring now to the drawing, the switching system of the invention is illustrated in a two-way radio transmitter and receiver may be of known construction, and a receiver 11, both represented by blocks. The transmitter and receiver may be of known construction, and are connected to antenna 12 through diplexer 13. Waves of the transmitting frequency are applied from the transmitter to the antenna, and waves of the receiving frequency are applied from the antenna to the receiver. Oscillators 15, 16 and 17 are connected to buffer amplifier 18, which applies oscillations to both transmitter 10 and receiver 11. The oscillations may be multiplied in the transmitter and modulated in any desired way, as by frequency modulation. The oscillations from buffer amplifier 18 may be multiplied and applied as local oscillations in a superheterodyne receiver. In some systems, the oscillations may be multiplied to the same extent in the receiver as the transmitter, so that the receiver responds to a frequency which differs from the frequency of the transmitter by the intermediate frequency of the superheterodyne receiver.

Although all three oscillators 15, 16 and 17 are simultaneously connected to the buffer amplifer 18, only one of the three oscillators will be energized at any given time, as will be described. Therefore a single frequency is applied to the buffer amplifier 18, and from the buffer amplifier to transmitter 10 and to receiver 11. The oscillators may be of any desired type, such as crystal controlled oscillators which provide oscillations having frequencies which remain fixed within close limits.

A transistorized ring counter circuit having a number of stages corresponding to the number of oscillators is provided for selectively energizing the oscillators. In the system illustrated, three oscillators 15, 16 and 17 are provided, and the ring counter has three stages 20, 21 and 22. It is to be pointed out, however, that the system might have only two stages, or might have a number of stages considerably greater than three depending upon the number of units to be selectively energized. In one system under consideration the radio equipment has 11 oscillators for operating on 11 channels, and the ring counter therefore has 11 stages. Each of the transistor stages 20, 21 and 22 includes a PNP transistor and an NPN transistor connected together in a regenerative circuit.

When the system is first turned on, that is when energizing potential is applied to the transistor ring counter, the starting transistor 28 conducts. This is because the base electrode is negative with respect to the emitter electrode. This provides a positive potential at point 29 which is applied to the base electrode of NPN transistor 26 and to the collector electrode of PNP transistor 25. This will cause transistor 26 to start to conduct and the collector electrode becomes negative to cause the base electrode of transistor 25 to become negative, so that this transistor also conducts. This action will reinforce itself until transistors 25 and 26 are both fully conducting. Oscillator 15 is permanently connected to the minus 10 volt terminal, and when the transistors 25 and 26 conduct, they effectively connect the oscillator to the positive terminal to thereby energize the oscillator. Oscillator 15 therefore applies oscillations of a particular frequency to buffer amplifier 18.

After the starting transistor 28 has operated to insure initial actuation of stage 20, the current drawn by stage 20 through resistor 39 will drop the voltage appearing across resistors 30 and 31. This will in turn drop the voltage applied to the base electrode of transistor 28 to a point such that transistor 28 will be cut off. Accordingly, when any of the stages 20, 21 or 22 is conducting, the voltage applied to the base electrode of transistor 28 is such that this transistor cannot conduct. Therefore, the starting transistor will conduct only when all of the stages of the ring counter are non-conducting.

Pulses for causing operation of the ring counter can be applied thereto from multivibrator 32 or multivibrator 34. Multivibrator 32 provides relatively fast recurring pulses such as 500 cycles per second. Multivibrator 34 provides slowly repeating pulses at a frequency such as 4 cycles per second. Each of the multivibrator circuits may be known construction.

The multivibrator 32 is controlled by control stage 35 which is coupled by switches 36, 37 and 38 to the stages 20, 21 and 22 respectively of the ring counter. The switches 36, 37 and 38 can be provided by a push button control unit, with the switches interlocked so that operation of any switch will release the others. Other switches and controls for the transmitter and receiver unit may be provided on the same control unit.

The transistor of the control stage 35 is conducting when the switch associated with the energized ring counter stage is actuated. That is, when switch 36 is closed and stage 20 becomes actuated, as has been described, the position potential applied to the oscillator 15 is also applied through resistor 40, diode 41, switch 36 and resistor 42 to the base electrode of the transistor of stage 35. This cause the stage 35 to conduct. In the event that the switch 36 is open and the switch 37 is closed, the positive potential is removed from the base of the transistor of stage 35 and this stage is cut off. This allows the emitter of stage 47 to go positive so that this stage begins conduction, and the multivibrator 32 can start operating.

The multivibrator 32 includes transistors 46 and 47, and applies pulses through capacitor 48 and diode 49 to the base electrode of the transistor of the drive amplifier 50. These pulses drive the transistor of stage 50 to cut off so that the potential of its collector electrode increases, and a negative going potential is applied through capacitor 51 and resistor 52 to the emitter electrode of transistor 25 of stage 20. Actually this is applied to the emitter electrode of the PNP transistor of each counter stage, but only the stage 20 is conducting. This potential turns off transistor 25 so that its collector electrode goes negative, and this drives the base electrode of transistor 26 negative so that this NPN transistor is also turned off.

When transistors 25 and 26 are turned off, the capacitor 55 of the ring counter stage 21 starts to charge to the negative supply through the connection through oscillator 15. Capacitor 55 can also charge through resistor 40 if the switch 36 had been closed to select stage 20. The diode 33 connected between point 29 and capacitor 55 provides a path for the capacitor 55 to charge from the negative potential. The diode 33 is provided to reduce the alternating current gain of the coupling between stages to prevent undesired oscillations. The negative pulse applied from the drive amplifier 50 to the emitter electrodes of the PNP transistors of the counter stages is of short duration and will disappear before capacitor 55 is charged. This will cause the base electrode of the PNP transistor 56 of the stage 21 to be driven negative, and this transistor will start to conduct.

When transistor 57 conducts, its collector electrode will go positive to drive the base electrode of transistor 57 positive. Transistor 57 will therefore conduct and its collector electrode will go negative to drive the base electrode of transistor 56 more negative. This regenerative action will render transistors 56 and 57 fully conductive quite rapidly to establish a circuit for energizing oscillator 16. The positive potential at the collector electrode of transistor 56 and at the base electrode of transistor 57 is applied through resistor 58 and diode 59, and if switch 37 is closed, this potential will be applied through resistor 42 to the base electrode of transistor 35. This will render transistor 35 conducting to provide a negative potential at its collector electrode which is applied to the multivibrator 32 to turn it off.

If, on the other hand, the switch 37 is open, there is no connection to the control stage 35 so that the multivibrator 32 will continue to provide drive pulses to amplifier 50 which are then applied to the stages 20, 21 and 22 so that conduction is shifted from stage 21 to stage 22. Stage 22 includes PNP transistor 60 and NPN transistor 61 which are connected and operate in the same manner as transistors 25 and 26 of stage 20, and transistors 56 and 57 of stage 21. It is noted that the collector electrode of transistor 60 is connected through capacitor 27 of stage 20. This capacitor charges to render stage 20 active when stage 22 is cut off. The stages 20, 21 and 22 are therefore connected in a ring with the conduction being shifted from one to another when pulses are applied to the emitter electrodes of the transistors 25, 56 and 60.

It will be apparent that if a larger number of stages is required in the ring counter, the stages can all be identical to the stages 20, 21 and 22. Terminals 65, 66, 67, 68, 69 and 70 can be opened to permit the insertion of additional stages as may be desired.

Inasmuch as it is not normally desired to change the tuning of the radio equipment during transmissions, a gate is provided to prevent application of pulses to drive amplifier 50 during transmissions. The diode 49 serves as this gate through which signals are applied from multivibrator 32 to drive amplifier 50. This diode is rendered non-conducting to prevent the application of pulses to the drive amplifier 50 when the transmitter 10 is operating. This action may be provided by the circuit including resistor 72, capacitor 73 and resistors 74 and 75. When the transmitter 10 is energized, a negative potential is applied from the transmitter through resistor 72 to the junction between resistors 74 and 75. This provides a negative bias on diode 49 to render the same non-conducting. This therefore inhibits the application of pulses from multivibrator 32 to drive amplifier 50.

It may be desired to provide automatic switching of the oscillator 15 in accordance with signals received, rather than through control of the switches 36, 37 and 38. This operation can be used, for example, in a system wherein an idle channel tone is applied to one channel and all radio units of the system are tuned to this channel to be in condition to receive calling signals thereon. In such case a tone selector 80 is coupled to receiver 11 for providing a control voltage when a particular tone is received by the receiver. This control voltage is applied to the multivibrator 34 to turn off this multivibrator. In the event that the tone is removed from a channel to which the equipment is tuned, the control voltage will disappear and the multivibrator 34 will start operating to apply pulses through capacitor 81 to the drive amplifier 50. These pulses will then be applied to the emitter electrodes of transistors 25, 56 and 60 so that the ring counter will step from one stage to another. As previously stated, the multivibrator 34 has a very slow rate, such as 4 cycles per second, so that the equipment will remain tuned to a channel for sufficient time so that the receiver 11 can receive signals being applied to the channel. If the idle channel tone is received, this will be detected by the tone selector 80 to provide the control voltage which is applied to the multivibrator 34 to turn it off. Accordingly, the equipment will remain tuned to the channel having the idle tone. If the idle tone is not received, the multivibrator 34 will continue operation so that the system steps from one stage to another to receive one channel after another until the channel having the idle tone is finally reached. The system will then stop on the channel on which the idle tone is applied.

By the use of complementary transistors in each of the stages of the ring counter, that is the use of a PNP transistor and an NPN transistor, both transistors are normally cut off and are rendered conducting only when the particular stage is actuated. Accordingly, current is drawn only by the stage which is actuated to energize an oscillator. This results in reduction of power consumption, particularly in a system wherein a large number of oscillators are used. In the system mentioned in which 11 different oscillators are used for tuning to 11 channels, so that 11 stages are required in the ring counter, only one of the 11 stages is energized at any time, and the power consumed is a minimum.

It is important in the operation of the system there two oscillators not be energized at a time. As previously stated the oscillators are all connected in parallel to the buffer amplifier 18, and improper operation would result if more than one oscillator applies oscillations thereto. This action is prevented in the system illustrated by the action of resistors 39 and 52. These resistors are in the energizing circuit for all the stages of the ring shifter, and if two ring shifter stages are rendered operative at the same time, current for these stages through resistors 39 and 52 will drop the voltage to a point such that conduction of both stages cannot continue. This will insure that two stages are not simultaneously energized to apply two different frequencies to the buffer amplifier and to the transmitter and receiver.

The system illustrated has been described for manual operation in which the ring counter is caused to step rapidly from one stage to another to operate on a selected channel, and for automatic operation in which the ring counter steps slowly so that the signal on each channel can be sensed before stepping to the next channel. It may also be desired to operate the system so that it steps rapidly through certain stages and slowly through other stages for sensing signals on the channels. For example, the channels tuned by oscillators 15 and 16 can be designated home channels, and the ring counter should step slowly through stages 20 and 21 so that the presence of an idle tone on one of these channels can be detected. However, the channel associated with oscillator 17 would not be a home channel and the ring counter would move rapidly through stage 20 to speed up the operation. This type of operation is particularly important when a large number of channels are available with only certain channels being designated home channels for any particular radio unit. The particular channels on which fast and slow stepping takes place can be selected by switches on the control panel, or the system can be prewired to provide the desired operation. The switches 36, 37 and 38 described for selecting channels during manual operation can be used for designating the home channels by providing extra contacts on the same switch structures.

The system of the invention has been found to be highly satisfactory. The transmitter-receiver unit can be rendered operative for a particular channel very rapidly by using manual selection, as from a push button control head. The unit can also be automatically switched at a slower rate from channel to channel until the channel providing a particular signal is reached. The switching circuit has provisions to insure that a particular stage will be actuated when the circuit is energized and that two stages will not be energized simultaneously.

We claim:

1. A system for actuating a selected one of a plurality of units including in combination, a transistorized ring counter circuit having a plurality of stages individually associated with the units, switch means having a plurality of portions individually associated with said stages, said switch means being operable to select one of said stages and the associated unit, said counter circuit including means coupling said stages thereof to each other and responsive to pulses applied thereto to cause energization of said stages in turn, each of said stages when energized operating to actuate the associated unit, starting means coupled to one of said stages for energizing said one stage when the system is first energized, pulsing means coupled to said counter circuit and operable for applying pulses thereto to cause energization of said stages and actuation of the associated units in turn, said pulsing means including a first portion providing pulses at a relatively slow rate and a second portion providing pulses at a relatively fast rate, said first portion of said pulsing means being coupled to said switch means and being disabled thereby when the stage associated with the selected unit is actuated, and means responsive to operation of the units coupled to said second portion of said pulsing means for disabling the same.

2. A system for actuating a selected one of a plurality of units including in combination, stepping means having a plurality of portions individually associated with the units, switch means having a plurality of portions individually associated with said portions of said stepping means and operable to select one of such portions and the associated unit, said stepping means including counter means coupled to said portions thereof and responsive to pulses applied thereto to cause actuation of such portions in turn, each of said portions of said stepping means when actuated operating to actuate the associated unit, pulsing means coupled to said stepping means and having first and second portions operable for applying pulses to said stepping means to cause actuation of said portions thereof and of the associated units in turn, said first portion of said pulsing means providing pulses at a relatively fast rate and said second portion thereof providing pulses at a relatively slow rate, said first portion of said pulsing means being coupled to said switch means and being disabled thereby when the portion of said stepping means associated with the selected unit is actuated, and means responsive to operation of the units coupled to said second portion of said pulsing means for disabling the same.

3. A control circuit for a transmitter-receiver system including a plurality of oscillators each of which is adapted to cause operation of the transmitter-receiver system on one of a plurality of channels of different frequency, said control circuit actuating a selected one of the oscillators and including in combination, a ring counter circuit having a plurality of stages individually associated with the oscillators, switch means having a plurality of portions individually associated with said stages, said switch means being operable to select one of the said stages and the associated oscillator, said counter circuit including means coupling said stages thereof to each other and responsive to pulses applied thereto to cause energization of said stages in turn, each of said stages when energized establishing a connection for energizing the associated oscillator, and pulsing means coupled to said counter circuit and operable for applying pulses thereto to cause energization of said stages and the associated oscillators in turn, said pulsing means being coupled to said switch means and being disabled thereby when the stage associated with the selected oscillator is energized.

4. A control circuit for a transmitter-receiver system including a plurality of oscillators each of which is adapted to cause operation of the transmitter-receiver system on one of a plurality of channels of different frequency, said control circuit actuating a selected one of the oscillators and including in combination, a transistor ring counter circuit having a plurality of stages individually associated with the oscillators, each of said stages including a pair of complementary transistors, said stages having a common circuit portion with resistance such that current therethrough drops the voltage applied to each stage to a value such that simultaneous conduction of two stages is prevented, switch means having a plurality of portions individually associated with said stages, said switch means being operable to select one of the said stages and the associated oscillator, said ring counter circuit including means coupling said stages thereof to each other and responsive to pulses applied thereto to cause energization of said stages in turn, each of said stages when energized establishing a connection for energizing the associated oscillator, and pulsing means coupled to said counter circuit and operable for applying pulses thereto to cause energization of said stages and the associated oscillators in turn, said pulsing means being coupled to said switch means and being disabled thereby when the stage associated with the selected oscillator is energized.

5. A system for selectively actuating one of a plurality of tuning units including in combination, a transistorized ring counter circuit having a plurality of stages individually associated with the units, said counter circuit including means coupling said stages thereof and responsive to pulses applied thereto to cause actuation of said stages in turn, each of said stages when actuated operating to actuate the associated tuning unit, starting means coupled to one of said stages for actuating said one stage when the system is first energized, pulsing means coupled to said counter circuit and operable for applying pulses thereto to cause actuation of said stages and the associated tuning units in turn, said pulsing means providing pulses at first and second different rates, and selector means coupled to said stages and to said pulsing means and responsive to operation of the actuated stage and the associated tuning to disable said pulsing means so that the actuated stage remains actuated.

6. A system for actuating a selected one of a plurality of tuning units including in combination, a transistorized ring counter circuit having a plurality of stages individually associated with the units, said counter circuit including means coupling said stages thereof and responsive to pulses applied thereto to cause energization of said stages in turn, each of said stages including a pair of complementary transistors which are rendered conducting to actuate the tuning unit associated therewith, said circuit including a portion common to all said stages through which current flows when said stages are energized and which produces a voltage drop in response to current flow therethrough to prevent simultaneous energization of two stages, pulsing means coupled to said counter circuit and operable for applying pulses thereto to cause energization of said stages and actuation of the associated tuning units in turn, and selector means coupled to said stages and to said pulsing means and responsive to operation of the energized stage and the associated tuning unit to disable said pulsing means so that the tuning unit associated with the energized stage remains actuated.

7. A control circuit for a two-way radio system including a transmitter and a receiver and a plurality of tuning units for providing operation on a plurality of channels at different frequencies, said control circuit actuating a selected one of the tuning units to operate the transmitter and receiver on a selected channel and including in combination, a ring counter circuit having a plurality of stages individually associated with the tuning units, said counter circuit including means coupling said stages thereof and responsive to pulses applied thereto to cause energization of said stages in turn, each of said stages when energized establishing a connection for actuating the associated tuning unit, said counter circuit including gate means coupled to the transmitter, pulsing means coupled to said gate means to apply pulses to said counter circuit to cause energization of said stages and actuation of the associated tuning units in turn to operate the transmitter and receiver on different channels, said gate means blocking the application of pulses when the transmitter is energized, and selector means coupled to the receiver and responsive to a particular received signal for disabling said pulsing means to hold actuated the tuning unit for the channel on which the particular signal is received.

8. A control circuit for a two-way radio system including a transmitter and a receiver and a plurality of tuning units for providing operation on a plurality of channels at different frequencies, said control circuit actuating a selected one of the tuning units to operate the transmitter and receiver on a channel to which a particular signal is applied and including in combination, a stepping circuit having a plurality of portions individually associated with the tuning units, said stepping circuit including counter means coupled to said portions thereof and responsive to pulses applied thereto to cause actuation of said portions in turn, each of said portions when actuated establishing a connection for actuating the associated tuning unit, pulsing means coupled to said stepping circuit and operable for applying pulses thereto at relatively fast and slow rates to cause actuation of the tuning units in turn to operate the transmitter and receiver on different channels, and selector means having a portion coupled to the receiver and operative during the application of pulses at the slow rate for producing a control voltage in response to reception of the particular signal, said selector means including a portion coupled to said pulsing means for applying said control voltage thereto to disable said pulsing means, whereby said energizing circuit holds actuated the tuning unit for the channel from which the particular signal is received, said selector means including switch means coupled to said portions of said stepping circuit and operative during the application of pulses at the fast rate to disable said pulsing means.

9. A control circuit for a two-way radio system including a transmitter and a receiver and a plurality of oscillators for providing operation on a plurality of channels at different frequencies, said control circuit actuating a selected one of the oscillators to operate the transmitter and receiver on a channel to which a particular signal is applied, said control circuit including in combination, a stepping circuit having a plurality of stages individually associated with the oscillators, said stepping circuit including means coupling said stages thereof and responsive to pulses applied thereto to cause energization of said stages in turn, each of said stages when energized establishing a connection for energizing the associated oscillator, starting means coupled to one of said stages for energizing said one stage when the circuit is first energized, pulsing means coupled to said stepping circuit and operable for applying pulses thereto to cause energization of said stages and the associated oscillators in turn to operate the transmitter and receiver on different channels, and selector means coupled to the receiver and responsive to received signals for producing a control voltage in response to reception of the particular signal, said selector means including a portion coupled to said pulsing means for applying said control voltage thereto to disable said pulsing means, whereby said energizing circuit holds energized the oscillator for the channel from which the particular signal is received.

10. A control circuit for a two-way radio system including a transmitter and a receiver and a plurality of tuning units for providing operation on a plurality of channels at different frequencies, said control circuit actuating a selected one of the tuning units to operate the transmitter and receiver on a selected channel, said control circuit including in combination, a transistor ring counter circuit having a plurality of stages individually associated with the tuning units, said counter circuit including means coupling said stages thereof and responsive to pulses applied thereto to cause actuation of said stages in turn, each of said stages when actuated operating to actuate the associated tuning unit, pulsing means coupled to said counter circuit and operable for applying pulses thereto to cause energization of said stages and the associated tuning units in turn to operate the transmitter and receiver on different channels, said pulsing means being operable to apply to said counter circuit pulses occurring at first and second rates, and selector means coupled to said pulsing means and responsive to actuation of said stages and the associated tuning unit for disabling said pulsing means to hold actuated the tuning unit for a particular channel.

11. A control circuit for a two-way radio system including a transmitter and a receiver and a plurality of tuning units for providing operation on a plurality of channels at different frequencies, said control circuit actuating a selected one of the tuning units to operate the transmitter and receiver on a selected channel, said control circuit including in combination, a transistorized stepping circuit having a plurality of portions individually associated with the tuning units, said stepping circuit including counter means coupled to said portions thereof and responsive to pulses applied thereto to actuate said portion in turn, each of said portions when actuated establishing a connection for rendering operative the associated tuning unit, first pulsing means operating at a first rate coupled to said stepping circuit and operable to apply pulses thereto to cause actuation of said portions and the associated tuning units in turn to operate the transmiter and receiver on different channels, switch means having a plurality of portions individually associated with said portions and operable to select one of the said portions and the associated tuning unit, said switch means being coupled to said first pulsing means and disabling the same when the stage associated with the selected tuning unit is energized, second pulsing means operating at a slower rate than said first pulsing means coupled to said stepping circuit and operable to apply pulses thereto to cause actuation of said portions and the associated tuning units in turn, and selector means coupled to the receiver and responsive to received signals for producing a control voltage in response to reception of a particular signal, said selector means including a portion coupled to said second pulsing means for applying said control voltage thereto to disable said second pulsing means, whereby said energizing circuit holds energized the tuning unit for the channel from which the particular signal is received.

12. A control circuit for a two-way radio system including a transmitter and a receiver and a plurality of tuning units for providing operation on a plurality of channels at different frequencies, said control circuit energizing a selected one of the tuning units to operate the transmitter and receiver on a selected channel and, including in combination, a transistorized ring counter circuit having a plurality of stages individually associated with the tuning units, said counter circuit including means coupling said stages thereof and responsive to pulses applied thereto to cause energization of said stages in turn, each of said stages when energized establishing a connection for energizing the associated tuning unit, said counter circuit including gate means coupled to the transmitter, first pulsing means coupled to said gate means to apply pulses to said counter circuit to cause energization of said stages and the associated tuning units in turn to operate the transmitter and receiver on different channels, said gate means blocking the application of pulses when the transmitter is energized, switch means having a plurality of portions individually associated with said stages and operable to select one of the said stages and the associated tuning unit, said switch means being coupled to said first pulsing means and disabling the same when the stage associated with the selected tuning unit is energized, second pulsing means coupled to said counter circuit and operable to apply pulses thereto to cause energization of said stages and the associated tuning units in turn, and selector means coupled to the receiver and responsive to received signals for producing a control voltage in response to reception of a particular signal, said selector means including a portion coupled to said second pulsing means for applying said control voltage thereto to disable said second pulsing means, whereby said energizing circuit holds energized the tuning unit for the channel from which the particular signal is received.

13. A control circuit for a two-way radio system including a transmitter and a receiver and a plurality of tuning units for providing operation on a plurality of channels at different frequencies, said control circuit actuating a selected one of the tuning units to operate the transmitter and receiver on a selected channel, said energizing circuit including in combination, a transistorized stepping circuit having a plurality of stages individually associated with the tuning units, said stepping circuit including means coupling said stages thereof and responsive to pulses applied thereto to cause actuation of said stages in turn, starting means coupled to one of said stages for actuating said one stage when the circuit is first energized, each of said stages including a pair of complementary transistors which are rendered conducting to energize the associated tuning unit, said circuit including a portion common to all said stages through which current for all said stages flows and which produces a voltage drop to prevent simultaneous actuation of two stages, said stepping circuit including gate means coupled to the transmitter, first pulsing means operating at a first rate coupled to said gate means to apply pulses to said stepping circuit to cause energization of said stages and the associated tuning units in turn to operate the transmitter and receiver on different channels, said gate means blocking the application of pulses when the transmitter is energized, switch means having a plurality of portions individually associated with said stages and operable to select one of the said stages and the associated tuning unit, said switch means being coupled to said first pulsing means and disabling the same when the stage associated with the selected tuning unit is energized, second pulsing means coupled to said stepping circuit and operable at a rate greater than said first rate to apply pulses to cause energization of said stages and the associated tuning units in turn, and selector means coupled to the receiver and responsive to received signals for producing a control voltage in response to reception of a particular signal, said selector means including a portion coupled to said second pulsing means for applying said control voltage thereto to disable said second pulsing means, whereby said energizing circuit holds energized the tuning unit for the channel from which the particular signal is received.

14. A control circuit for a two-way radio system including a transmitter and a receiver and a plurality of tuating a selected one of the tuning units to operate the channels at different frequencies, such control circuit actuatign a selected one of the tuning units to operate the transmitter and receiver on a selected channel and including in combination, a transistorized stepping circuit having a plurality of portions individually associated with the tuning units, said stepping circuit including counter means operating in response to pulses applied thereto to cause actuation of said portions of said stepping circuit in turn, each of said portions when actuated causing operation of the associated tuning unit, pulsing means coupled to said counter means and operable for applying pulses thereto to cause operation of the tuning units in turn to render the transmitter and receiver operative on different channels, said pulsing means being operable to selectively apply to said counter means pulses occurring at first and second different rates, and selector means coupled to said portions of said stepping circuit and to said pulsing means and responsive to operation of said portions and to a particular received signal for disabling said pulsing means to hold actuated the tuning unit for the channel which provides the particular received signal.

15. A control circuit in accordance with claim 14 including gate means coupling said pulsing means to said counter means, and means for actuating said gate means to block the application of pulses therethrough during operation of the transmitter.

References Cited

UNITED STATES PATENTS

| | | | |
|---|---|---|---|
| 2,773,176 | 12/1956 | Braak et al. | 325—25 X |
| 3,083,306 | 3/1963 | Lindstrom et al. | 307—88.5 |
| 3,121,846 | 2/1964 | Wormser | 331—57 X |
| 3,225,215 | 12/1965 | Winter | 307—88.5 |
| 3,296,550 | 1/1967 | Hukami et al. | 325—169 X |

JOHN W. CALDWELL, *Acting Primary Examiner.*